United States Patent
Blackman et al.

(10) Patent No.: US 11,437,851 B2
(45) Date of Patent: Sep. 6, 2022

(54) PLATED COPPER CONDUCTOR STRUCTURES FOR WIRELESS CHARGING SYSTEM AND MANUFACTURE THEREOF

(71) Applicant: DUPONT ELECTRONICS, INC., Wilmington, DE (US)

(72) Inventors: Gregory Scott Blackman, Media, PA (US); Wei Wu, Hockessin, DE (US)

(73) Assignee: DUPONT ELECTRONICS, INC.

( * ) Notice: Subject to any disclaimer, the term of this patent is extended or adjusted under 35 U.S.C. 154(b) by 0 days.

(21) Appl. No.: 17/084,556

(22) Filed: Oct. 29, 2020

(65) Prior Publication Data

US 2021/0249902 A1    Aug. 12, 2021

Related U.S. Application Data

(60) Provisional application No. 62/972,908, filed on Feb. 11, 2020.

(51) Int. Cl.
| | |
|---|---|
| *H02J 50/10* | (2016.01) |
| *H01F 41/26* | (2006.01) |
| *H01F 5/00* | (2006.01) |
| *H02J 50/00* | (2016.01) |

(52) U.S. Cl.
CPC ............ *H02J 50/10* (2016.02); *H01F 5/003* (2013.01); *H01F 41/26* (2013.01); *H02J 50/005* (2020.01)

(58) Field of Classification Search
CPC ......... H02J 50/10; H02J 50/005; H01F 41/26; H01F 5/003
USPC ........................................................ 307/149
See application file for complete search history.

(56) References Cited

U.S. PATENT DOCUMENTS

| | | | | |
|---|---|---|---|---|
| 10,532,691 | B2* | 1/2020 | Dellock | B60Q 1/32 |
| 2008/0246664 | A1* | 10/2008 | Ikemoto | G06K 19/07749 |
| | | | | 343/895 |
| 2010/0314455 | A1* | 12/2010 | Kato | H01Q 21/29 |
| | | | | 235/492 |
| 2012/0306719 | A1* | 12/2012 | Takeoka | H05K 1/141 |
| | | | | 343/866 |
| 2013/0186961 | A1* | 7/2013 | Kimura | G06K 19/07786 |
| | | | | 235/492 |
| 2013/0194149 | A1* | 8/2013 | Kimura | H01Q 9/16 |
| | | | | 343/822 |
| 2014/0292610 | A1* | 10/2014 | Iwahashi | H01Q 1/2225 |
| | | | | 343/867 |
| 2015/0048163 | A1* | 2/2015 | Senior | H01Q 1/2216 |
| | | | | 235/439 |
| 2017/0271757 | A1* | 9/2017 | Kato | G06K 19/07794 |

(Continued)

OTHER PUBLICATIONS

Leeuw et al., "Electroplating of conductive polymers for the metallization of insulators", Synthetic Metals, vol. 66, Issue 3, pp. 263-273, Oct. 1994.

*Primary Examiner* — Alfonso Perez Borroto
(74) *Attorney, Agent, or Firm* — John J Piskorski (57) ABSTRACT

A conductive structure is fabricated on a substrate (either flexible or rigid) by first printing a precursor seed layer of a conductive ink, then electroplating a highly conductive metal such as Cu or Ag onto the precursor. The plated layer has a conductivity approaching that of the bulk metal. To improve the uniformity of plating, an intervening layer of electroless metal may be deposited onto the precursor prior to electroplating. The structure may be used for applications such as coils used in a wireless power transfer system.

4 Claims, 6 Drawing Sheets

(56) References Cited

U.S. PATENT DOCUMENTS

2017/0368954 A1* 12/2017 Salter .................... H05B 45/37
2018/0279968 A1* 10/2018 Boyd ..................... H04R 1/46

* cited by examiner

PLATED COPPER CONDUCTOR STRUCTURES FOR WIRELESS CHARGING SYSTEM AND MANUFACTURE THEREOF

FIELD OF THE INVENTION

The present disclosure relates to copper conductive structures fabricated on a variety of substrates and a method for their manufacture. More particularly, the structures are manufactured by printing a thin layer of a conductive paste or ink on the substrate in a preselected pattern and then plating a layer of copper onto the conductive ink pattern to increase the conductance of the pattern. The patterns may be incorporated in a variety of electrical circuits in which high conductivity is beneficial. Such circuits include, without limitation, charging circuits that inductively couple energy for wireless charging or other related functions.

TECHNICAL BACKGROUND

Conductive structures disposed on a non-conductive or insulating substrate are used in a wide variety of electrical and electronic devices. The substrates include both rigid and flexible sheets of both inorganic and organic materials, with polymeric substrates being very common. The sizes of the structures in use span a wide range.

Despite the numerous techniques that have been used to manufacture these devices, there remain challenges for improving manufacturing cost and efficiency, increasing sustainability through prudent use of valuable materials, and creating complex structures that have acceptable electrical properties while being robust during manufacture and end use.

SUMMARY

An aspect of the present disclosure provides a conductive structure situated on an insulating substrate having first and second opposing major surfaces, the conductive structure having a preselected pattern and comprising:
  (a) a first layer of conductive ink having the preselected pattern and adhered to the first major surface; and;
  (b) a second layer of electroplated copper situated atop the first layer.

Another aspect provides a process for fabricating a conductive structure on a major surface of an insulating substrate having first and second opposing major surfaces, the process comprising the steps of:
  (a) printing a layer of conductive ink in a preselected pattern on the first major surface; and
  (b) electroplating copper onto the ink to form the conductive structure.

Still another aspect provides a system for wirelessly transferring electrical energy from a source to a load, the system comprising a transmitter circuit configured to be energized by the source and electrically connected to a transmitter coil and a receiver circuit configured to drive the load and electrically connected to a receiver coil, the transmitter and receiver coils being configured to be inductively coupled, and wherein at least one of the transmitter coil and the receiver coil comprises a conductive structure situated on a first major surface of a substrate and having the form of a spiral conductor comprising a plurality of turns, the conductive structure comprising:
  (a) a first layer of conductive ink adhered to the first major surface; and
  (b) a second layer of electroplated copper situated atop the first layer.

Yet another aspect provides a transmitter comprising a transmitter module and a transmitter coil electrically connected thereto. The transmitter coil comprises a conductive structure situated on an insulating substrate having first and second opposing major surfaces, the conductive structure having a preselected pattern and comprising:
  (a) a first layer of conductive ink having the preselected pattern and adhered to the first major surface; and
  (b) a second layer of electroplated metal situated atop the first layer.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

DETAILED DESCRIPTION

Various aspects of the present disclosure relate to a conductive structure fabricated by first depositing a conductive ink on a substrate in a preselected pattern, then electroplating the deposited ink with a highly conductive metal to provide the overall conductive structure with increased thickness, and thus conductivity. Other aspects relate to a process for the manufacture of the conductive structure and end uses thereof.

One approach for fabricating complex conductive structures on substrates is widely practiced in the manufacture of either rigid or flexible circuit boards. A thin copper foil is laminated onto the entire surface of a substrate that can be either rigid (such as a fiberglass-reinforced epoxy sheet) or flexible (such as a thin polyimide film). Then a pattern representing the desired final configuration of conductive traces is formed by photolithographic techniques. Areas of the copper foil where conductor is not wanted are dissolved by a chemical etchant, leaving behind the desired pattern.

Approaches of this type are ordinarily termed "subtractive." Very intricate patterns can be formed because of the sophistication of available photolithography methods. The copper used has high intrinsic conductivity, approaching the best levels attainable with bulk copper, and the traces ordinarily can be made with sufficient thickness by starting with a relatively thick foil laminate. Nevertheless, subtractive processes typically are expensive and create a large volume of liquid waste that is usually hazardous and toxic. The copper can be recovered, but at the cost of reducing copper ions in the liquid back to metallic copper.

Alternatively, traces of copper or other conductive metal having a desired configuration can be formed by cutting the desired pattern out of a sheet by known mechanical scribing or cutting techniques or by laser-assisted cutting techniques, then removing material in the other areas. Although the scrap created by these methods is still the conductive metal, considerable rework or reprocessing may be required to reuse the scrap.

It would therefore be beneficial to have manufacturing techniques capable of directly creating a structure with the desired final configuration or a close approximation to it. Such techniques are often termed "additive;" the resulting structures may be described as "net shape" or "near net shape." Additive techniques are already known for some end uses. For example, structures may be created using a wide range of printing methods that deposit a conductive ink in any desired pattern. Such printing methods include ink-jet, stencil, screen, and three-dimensional printing.

However, the electrical performance attainable with printed ink is limited. Conductive inks ordinarily contain finely divided powders of a conductive material dispersed in a carrier liquid or solvent that may include a binder or other beneficial substances. The best conductivity is obtained with inks having a high proportion of a highly conductive metal powder. After deposition, the carrier liquid is typically removed by drying, either at ambient temperature or under modest heating. The deposited pattern derives its conductivity through a percolative path defined by contact between adjacent particles. For this reason, silver-based inks are preferred, because silver particles resist surface oxidation or other corrosion, so there is ordinarily less contact resistance at the interfaces between contiguous particles. However, copper is sometimes used. For either, the contact attainable results in a conductivity well below the intrinsic conductivity of a solid conductor of the same metal, because of both the limited total area of actual interparticle contact and interfacial resistance due to any surface oxidation. A conductivity of this low level is adequate for some applications, such as shielding, but applications that must sustain high current densities may not be viable. While the resistance of a structure could in principle be decreased by printing an ink layer wider or thicker (or both), there are practical limits. As thickness increases, it is difficult to avoid cracks or other defects that negate the potential reduction in effective resistance. Design considerations may limit the allowable width of a conductive trace.

In some end uses, the conductivity of a printed paste or ink is enhanced by a heat treatment of the deposit at a temperature high enough to cause sintering of adjacent metal particles. But most polymeric substrates cannot withstand the temperatures needed for any sintering to occur, which is typically several hundred degrees Celsius.

The present inventors have found an alternative approach that provides high conductivity without requiring a high temperature heat treatment. The desired pattern is first formed by printing and possibly drying a relatively thin layer of conductive ink, such as a silver-based ink, to form a precursor structure or seed layer, which is then used as a cathode for a copper plating operation. The plating can be carried out to produce a relatively thick layer of copper that closely replicates the geometry of the ink pattern and attains a conductivity level approaching that of bulk copper. Plating with silver is alternatively contemplated herein, but ordinarily the far lower cost of copper suggests its use.

As is known in the art, electroplating is carried out to deposit metal from an anode onto a cathode provided as a workpiece to be plated. In an implementation of the present method, the terminals of an electric power source are connected respectively to one or more Cu metal anodes and the cathode. Here, the cathode is provided initially by the precursor conductive seed layer. The anode(s) and cathode are immersed in an electrolytic plating bath, such as an aqueous $H_2SO_4$ solution with dissolved Cu ions. Current flows from the supply to the anode(s), through the plating bath to the cathode, and then back to the supply, with copper atoms being removed from the anode and deposited onto the cathode.

In an embodiment, the conductive ink in the precursor must have, at minimum, a thickness sufficient to establish a conductive path that provides electrical continuity through the entire precursor, so that the desired configuration can be fully plated. The required ink thickness depends on the particular ink used, but a 10 μm layer is often convenient. In various embodiments, the resistivity of the conductive ink used is at most about 30, 50, 75, or 100 μΩ-cm. Certain implementations result in a conductive ink layer having a sheet resistance that is at most about 0.02, 0.03, 0.05, 0.07, or 0.1 Ω/square.

The conductivity of plated copper is ordinarily at least an order of magnitude or more larger than that of a typical conductive ink, so that a plating of even 1 μm or more may markedly enhance the conductivity of the finished structure. The resulting structure has sufficient total conductance to function adequately in a variety of end uses that could not be implemented viably using only printed conductors. In various embodiments, the electroplated layer has a thickness of at least 5, 10, 15, 20, 50, 75, 100, 150, or 200 μm, with the preferred thickness depending in part on the conductance required for a particular circuit application. In an embodiment, the thickness is an average value taken over the entire conductive structure. Ideally, the electroplated layer has a relatively smooth surface. In practice, the quality of the plated layer begins to deteriorate as thickness increases beyond certain limits. For example, the surface of plated layers of both copper and silver becomes undesirably nodular, internal stress increases (possibly resulting in cracks or other bulk defects), and overall conductivity does not increase commensurately with apparent thickness. Adhesion of the plated metal to the substrate may also be compromised for thick layers.

The present technique provides efficient use of the conductive metals in both the ink precursor and the plating overlay, since the desired configuration is formed directly, without needing to remove any substantial amount of material by etching or as scrap. Because the plated portion closely replicates the initial ink pattern, relatively intricate structures can be created simply and efficiently by using high resolution printing methods to form the precursor.

The conductive structure can have any convenient pattern that covers a portion, or even substantially all, of a major surface of the substrate. The high conductivity of the structure renders it suitable for use in a wide variety of circuits, either as a circuit element itself or as a conductor that electrically connects two or more circuit components of any type.

The present conductive structure can be fabricated on a variety of non-conductive substrates, including ones that are both rigid and flexible. Suitable rigid substrates include both inorganic and organic/polymeric base materials. Inorganic materials include, without limitation, silica, alumina, silicon, silicon carbide, quartz, glass, and GaAs/GaN semiconductors. Organic materials include, without limitation, various rigid polymeric materials and polymer composite materials that include inorganic filler materials. One exemplary composite material is sold commercially by DuPont de Nemours, Inc., Wilmington, Del., as CORIAN® solid surface material, which comprises a polymethylmethacrylate (PMMA) matrix and alumina trihydrate. Also usable is a fiberglass-reinforced epoxy sheet of the type commonly used in fabricating printed circuit boards.

The present structure can also be fabricated on a variety of foam board materials. Suitable boards include, without limitation, closed-cell polystyrene foam boards available from Dow Chemical, Midland, Mich. in grades designated as STYROFOAM™ Highload 40, 60, or 100 Extruded Polystyrene, depending on their compression strength. In some embodiments, the board or other insulating layer is nominally rigid, but sufficiently thin to retain some degree of flexibility, so that it can be used over substrates that are not completely flat.

Depending on the end-use application, the conductive structure can be manufactured on any plastic material that can be blown into foam. Suitable thermoplastics include polyolefins and alkenyl aromatic polymers. Suitable polyolefins include polyethylene and polypropylene. Suitable alkenyl aromatic polymers include polystyrene and copolymers of styrene and other monomers. Suitable polyethylenes include those of high, medium, low, linear low, and ultra low density types. It is also possible to form foam boards from thermoset polymers such as polyisocyanurate or rigid polyurethane.

In an embodiment, the substrate comprises a foam structure of an alkenyl aromatic polymer material. Suitable alkenyl aromatic polymer materials include alkenyl aromatic homopolymers and copolymers of alkenyl aromatic compounds and copolymerizable ethylenically unsaturated comonomers. The alkenyl aromatic polymer material may further include minor proportions of non-alkenyl aromatic polymers. The alkenyl aromatic polymer material may be comprised solely of one or more alkenyl aromatic homopolymers, one or more alkenyl aromatic copolymers, a blend of one or more of each of alkenyl aromatic homopolymers and copolymers, or blends of any of the foregoing with a non-alkenyl aromatic polymer. Regardless of composition, the alkenyl aromatic polymer material comprises greater than 50 and preferably greater than 70 weight percent alkenyl aromatic monomeric units. In some embodiments, the alkenyl aromatic polymer material is comprised entirely of alkenyl aromatic monomeric units.

Suitable alkenyl aromatic polymers include those derived from alkenyl aromatic compounds such as styrene, alphamethylstyrene, ethylstyrene, vinyl benzene, vinyl toluene, chlorostyrene, and bromostyrene. A preferred alkenyl aromatic polymer is polystyrene. Minor amounts of monoethylenically unsaturated compounds such as C2-6 alkyl acids and esters, ionomeric derivatives, and C4-6 dienes may be copolymerized with alkenyl aromatic compounds. Examples of copolymerizable compounds include acrylonitrile, acrylic acid, methacrylic acid, ethacrylic acid, maleic acid, itaconic acid, maleic anhydride, methyl acrylate, ethyl acrylate, isobutyl acrylate, n-butyl acrylate, methyl methacrylate, vinyl acetate and butadiene, in amounts consistent with maintaining desired properties, such as an adequately low water retention behavior. Embodiments beneficially comprise greater than 80 percent of polystyrene and can be made entirely of polystyrene.

In some embodiments, the foam structure incorporates one or more additives, such as inorganic fillers, nucleating agents, pigments, antioxidants, acid scavengers, infrared attenuators, ultraviolet absorbers, flame retardants, processing aids, extrusion aids, and the like. The foam board may be closed cell or open cell according to ASTM D2856-87.

Suitable flexible polymeric sheet materials include, without limitation, polyimide, polyethylene terephthalate, polycarbonate, and polyolefin materials. Other useful flexible substrates include fibrous polymers, of which one representative example is a moisture vapor-permeable, flash spun, plexifilamentary, high density polyethylene sheet available commercially from DuPont de Nemours, Inc., Wilmington, Del., under the tradename TYVEK®. The present process is especially beneficial in fabricating conductive structures on rough substrates, such as fibrous materials like the foregoing TYVEK® sheet, as it is difficult with conventional techniques to form a continuous and conductive precursor using other techniques, such as electroless deposition without an initial ink deposit. The chemistry of the plating bath, including its constituents and pH, should be compatible with the substrate material.

In some embodiments, the present conductive structure is elongated, meaning that its length is much larger than its width. In various embodiments, the ratio of length to width may be at least 50, 100, 300, 500, 1000, or 2000. For example, an elongated structure may have the form of a spiral comprising a plurality of turns. As used herein, the term "spiral" is based on the conventional mathematical sense of a locus defined by the path of a point in a plane that starts at an inner beginning point and moves around a central point while receding from it. The inner beginning point may, but need not, be the same as the central point. The conductive structure is formed by an unbroken conductive trace that follows the locus of the spiral.

In some spiral forms used for the present structure, the recession from the center point is continuous. One common form with a continuous and constant recession is conventionally termed an "Archimedean spiral," as depicted generally at 10 in FIG. 1. Such a spiral is defined by an inner diameter $r_i$, an outer diameter $r_o$, a trace width w, and a pitch P, which are measured as indicated. S is spacing between loops. Together, specifying these parameters results in a number of turns N.

Figure 2:
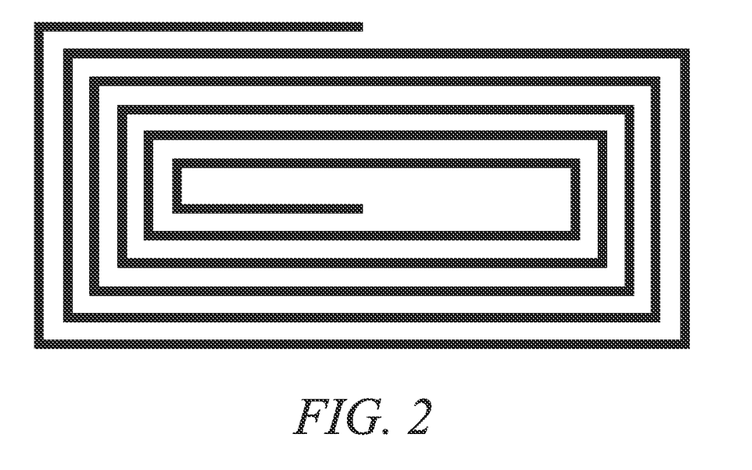
FIG. 2 depicts schematically a conductive structure of the invention having the form of a rectangular spiral.

Alternatively, the recession from the center of the spiral occurs turn by turn instead of continuously. For example, in the rectangular spiral depicted in FIG. 2, each point within a given turn in the spiral is spaced from the comparable point in an adjacent turn by a fixed distance. Although depicted in FIG. 2 with corners that are right-angled, a rectangular spiral might also be configured with rounded corners. S is spacing between loops, P is pitch, w is trace width, $r_i$ is inner diameter and $r_o$ is outer diameter. Other planar spiral forms that a skilled artisan will recognize, such as a square spiral comparable to the foregoing rectangular spiral, are also contemplated for the present conductive structure.

Spiral-form conductive structures are beneficially used in applications in which a substantial inductance is desired.

The use in a circuit of an inductor having conductors produced by the present printing/plating process is enhanced by its decreased resistance.

In another embodiment, the two ends of a spiral conductor are connected with an external capacitor to form a tank circuit, which has a resonant frequency determined by the geometry of the spiral and the chosen capacitance.

However, it has been found difficult to maintain a uniform thickness in the present conductive structures if the configuration includes a very long trace, whether straight or curved. For example, elongated traces are present in many spiral structures, as described above. Without being bound by any theory, it is believed that the thickness variation is attributable to variation in the total effective electrical impedance of the plating circuit seen by different portions along the length of the trace. In particular, the internal resistance of an elongated seed layer of material with relatively low inherent conductivity can form an appreciable fraction of the total impedance. Therefore, the electrical potential at each point at the bath-cathode interface during plating decreases with distance along the seed layer length from the point of connection to the power supply. The local potential at a given point affects both the initial nucleation of Cu deposits and the Cu deposition rate thereafter. It is believed that the plating is initiated near the connection point, where the potential is highest, with an initiation front that then advances along the trace length. Behind the initiation front, sufficient Cu is soon deposited to shunt and mitigate the low conductivity of the initial seed layer, so that the local potential does not decrease as much with distance away from the connection point. Subsequent to the initial nucleation, the deposition rate behind the advancing front, as measured normal to the substrate, is relatively consistent. Therefore, after any given plating duration, the plated layer is thickest near the connection point and progressively thinner going away from it. The disparity can be reduced by providing a higher conductivity seed layer, so that the initiation front moves more rapidly through the full extent of the precursor area, minimizing the portion of the plating cycle during which deposition is inhibited. Theoretical modeling by de Leeuw et al., *Synthetic Metals* 66 263-273 (1994), suggests that the rate of advance of the initiation front is approximately inversely proportional to the square root of the sheet resistance of the seed layer. The uniformity can also be improved by making direct connections can be made at a plurality of points along the precursor, so that there are multiple initiation fronts that need only to move over a shorter distance before full coverage is obtained and uniform deposition can thereafter occur. For example, connection might be made at both ends of a spiral structure, or at additional points along the extent of such a structure. The thickness disparity also becomes less pronounced as the overall plated thickness increases.

In some embodiments, the thickness variation may be further mitigated by reducing or eliminating the organic brightener frequently included in the coper plating bath.

In an embodiment, the thickness of the trace after the electroplating is substantially uniform, meaning that a ratio of the highest thickness along an extended trace to the lowest thickness is at most 6:1, 5:1, 4:1, 2:1, or 1.5:1. In a further embodiment, this ratio has any of the foregoing values and the lowest thickness along the trace is at least 2, 5, 10, 15, 20, or 50 µm. In still another embodiment, the ratio has any of the foregoing values and the highest thickness along the trace is at most 20, 50, 75, 100, 150, or 200 µm. The thickness in these embodiments may be measured using a variety of techniques. For example, the thickness may be measured by an x-ray fluorescence (XRF) technique, in which a fluorescent intensity is compared between the trace and a reference sample of the same material and known thickness. The XRF technique is non-destructive, and beneficially provides an average thickness over the local region illuminated by the x-ray beam. The thickness is also measurable non-destructively using scanning confocal microscopy, such as with a Keyence VK-X260K 3D Laser Scanning Confocal Microscope. In addition, traces may be measured destructively using micrographs taken in cross-section.

In some implementations, the foregoing problem of the low conductivity of the printed ink pattern and the ensuing variation of plated thickness is mitigated by disposing a metal enhancement layer between the conductive ink and the electroplated metal. This can be effected by an electroless plating step carried out before the electroplating step. The electroless plating step deposits additional metal, including without limitation copper or nickel, onto the printed ink pattern. For example, the added metal can provide additional connectivity between discrete particles within the printed pattern, which is especially beneficial for inks with low metal loading. The resulting improvement in the precursor's conductivity may improve the uniformity of the plated layer. In some embodiments, the addition of electroless metal can even bridge gaps across which the initial conductive ink deposit fails to provide conductivity. Without being bound by any theory, it is believed that metal particles in the initial conductive ink may act as catalytic sites that nucleate the deposition of electroless metal. Suitable electroless processes are ones in which metal is deposited only on the seed layer and possibly at its margins, and not in a more widespread layer encompassing most or all of the substrate.

Figure 3:
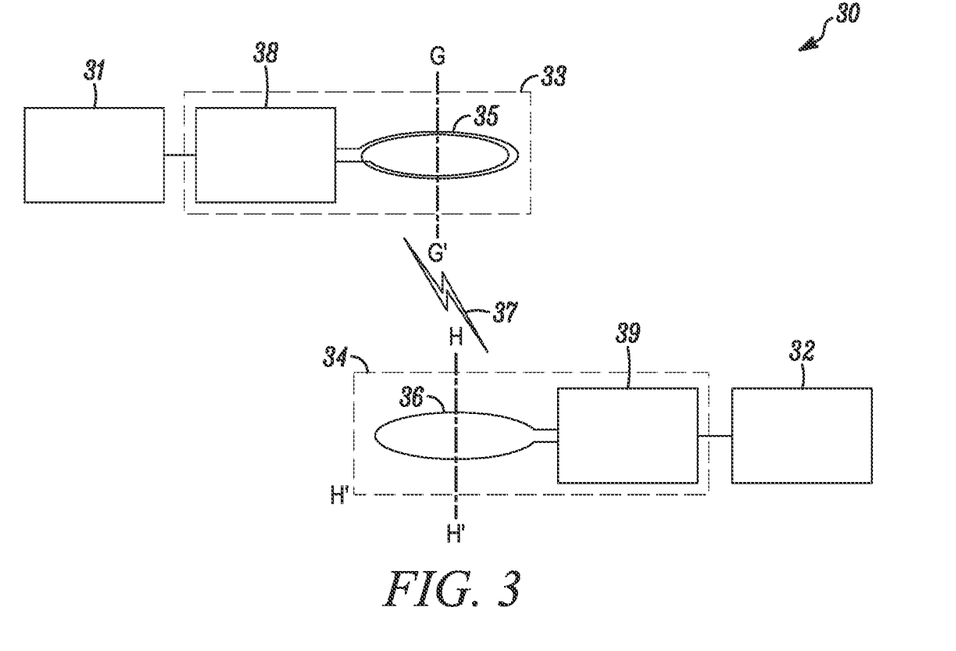
FIG. 3 is a schematic block diagram of a system for wirelessly transferring energy from a source to a load.

Other embodiments of this disclosure pertain to end uses of the conductive structure described above. For example, in an embodiment depicted generally in FIG. 3 at 30, one or more conductive structures made as described above are used in a system for wireless, inductive transfer of energy from a source 31 to a load 32. Such a system includes a transmitter 33 adapted to be connected to the source of electrical energy 31 and a receiver 34 adapted to be connected to the load 32. The transmitter and receiver comprise respective coils 35, 36 that are disposed to provide inductive coupling 37 therebetween. Thus, the coils collectively function as an electrical transformer through which energy can be transferred wirelessly. Typically, no other magnetic material is present, so that the transformer may be said to be an air-core transformer. However, in some implementations, the structure may include some amount of soft magnetic material that functions to direct the magnetic flux generated by the transmitter (or primary) coil to improve the coupling of the flux into the receiver (or secondary) coil. Either or both of the transmitter coil 35 and the receiver coil 36 comprises a conductive structure of any configuration made by the printing/plating process described above. In FIG. 3, transmitter coil 35 is depicted as an Archimedean spiral, although other configurations might also be used. Receiver coil 36 is shown with a single turn, but multiple turns might also be used. A system in which either of the coils, and preferably both, are constructed using conductors made as described herein benefits from their enhanced conductivity, so that the overall efficiency of the power transfer process is improved, as ohmic heating in either coil represents energy that is lost and thus not transferred. The enhanced conductivity also permits greater flexibility in design and allows acceptable power transfer despite wider spacing of the coils.

Transmitter 33 further comprises a transmitter module 38 that is configured to be operably connected to the source to receive electrical energy and to drive the transmitter coil 35 therewith to produce an electromagnetic field, e.g., in accordance with Ampere's law. Depending on the intended use of the system, transmitter module 38 may be connected either to an AC source, such as the electric power grid, or a DC source, such as a battery or some other electrical or electronic implement, such as a computer supply bus. The module 38 provides circuitry that receives the source energy and converts it to an AC current having a desired transfer frequency and waveform to drive the transmitter coil. Ordinarily, frequencies well above the 50-60 Hz typically used in the power grid are preferred to improve the amount of power and energy required for power transfer and to minimize the size of components needed.

The AC electromagnetic field produced by transmitter coil 35 induces an AC voltage in receiver coil 36, which is connected to a receiver module 39 that provides an output at a desired voltage and frequency. Ordinarily, receiver module 39 derives any power it needs to operate from receiver coil 36, and not from any battery or direct line connection. In an embodiment, transmitter 33 and receiver 34 are constructed in physically separable packages that need not be in a fixed relationship, as long as they are sufficiently proximate during operation.

Most commonly, the final output from receiver module 39 is a low DC voltage appropriate for directly powering a portable electrical or electronic appliance that may be of a wide variety of types, including without limitation a smartphone, tablet computer, flashlight, or the like. Alternatively, system 30 may be used to charge a battery that is incorporated in such a device to power it offline. In some embodiments, receiver 34 may be integrally included in the device being powered or charged. Either direct power or battery charging requirements are typically satisfied with a system capable of providing 10-100 W of available power, although designs for other power levels are also contemplated.

In an embodiment, the present system may be constructed and operated in accordance with the conventional Qi charging protocol, which is widely implemented for inductively transferring power to devices such as smartphones. The Qi protocol and standards are promulgated by the Wireless Power Consortium and are available at www.wirelesspowerconsortium.com/qi/. The transfer frequency in this protocol is said to be in the range 87 to 205 kHz. To improve power efficiency, the Qi protocol coils are often connected in parallel with a capacitance that provides an electrical resonance at least close to the operating frequency range. Transmitter and receiver modules for implementing the present system according to the Qi protocol or other suitable protocols are commercially available or can be fabricated by a skilled person.

In a further embodiment of the present system, the transmitter is configured as a charging station that may be disposed in a preselected, possibly fixed, location. A battery-powered device with integrated receiver can then be charged, when desired, by bringing it into appropriate proximity with the charging station, so that there is sufficient inductive coupling between the transmitter and receiver coils for power to be delivered so that the battery can be charged. The region surrounding the charging station within which there is sufficient coupling for the receiver to accept power defines a charging zone. As noted above, a system in which at least the transmitting coil, and preferably the receiving coil as well, is fabricated using the present process typically provides an enlarged charging zone.

Figure 1:
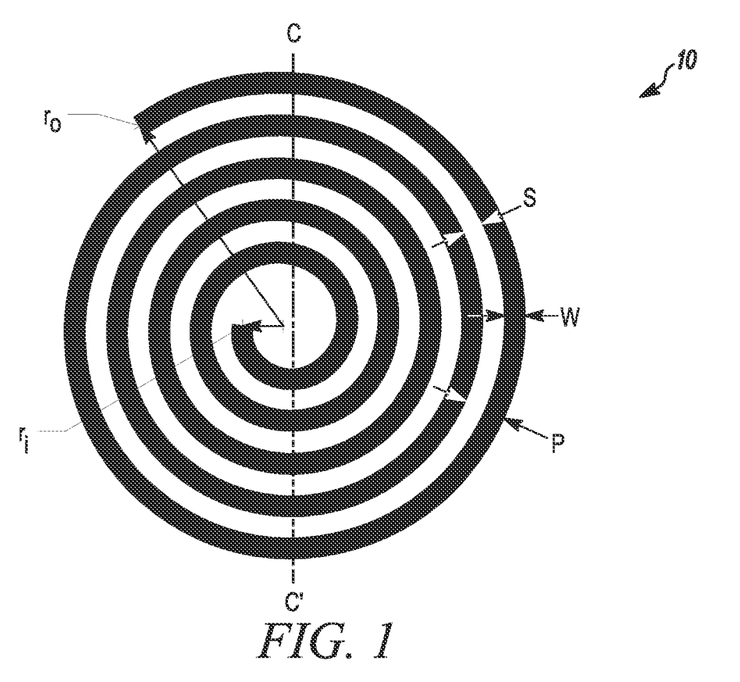
FIG. 1 depicts schematically a conductive structure of the invention having the form of an Archimedean spiral.
Figure 6:
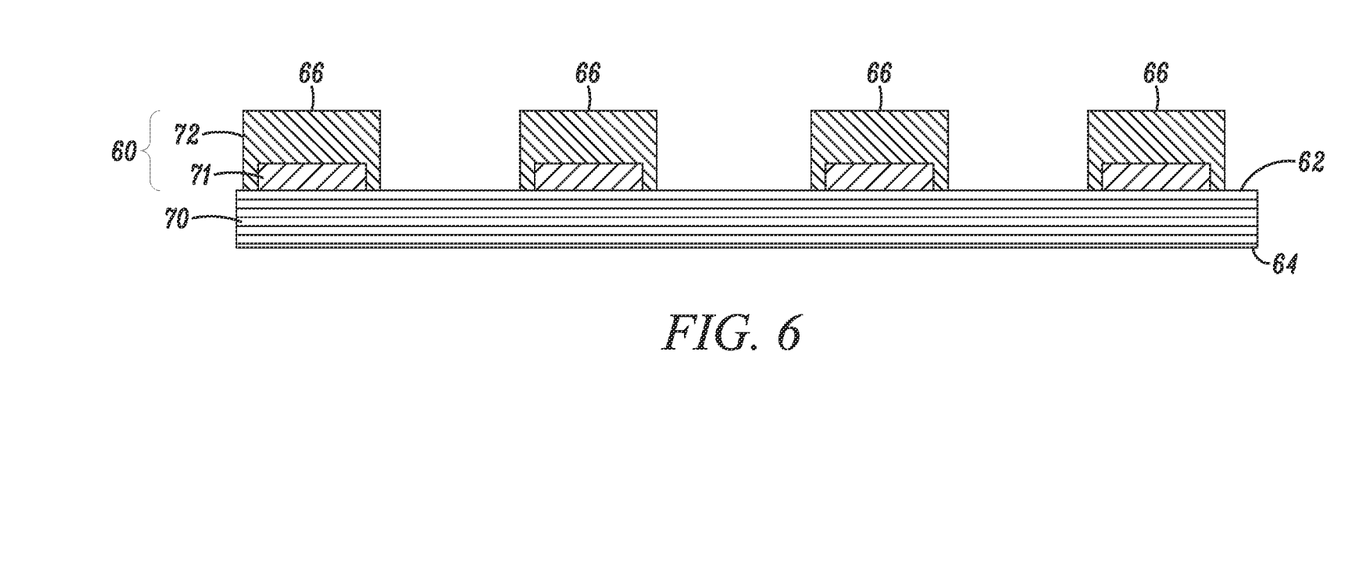
FIG. 6 depicts a cross-section CC' of FIG. 1, a conductive structure of the invention having a preselected pattern situated on an insulating substrate having first and second opposing major surfaces with a first layer of conductive ink adhered to the first major surface and a second layer of electroplated copper situated onto the first layer.

An aspect of the present disclosure, as shown in FIG. 6, is a cross-section CC' of the Archimedean spiral of FIG. 1. The Archimedean spiral provides a conductive structure 60 situated on an insulating substrate 70 having a first 62 and second 64 opposing major surfaces, the conductive structure 60 having a preselected pattern 66 and comprising: a first layer of conductive ink 71 having the preselected pattern 66 and adhered to the first major surface 62; and; a second layer of electroplated copper 72 situated onto the first layer of conductive ink 71.

Figure 7:
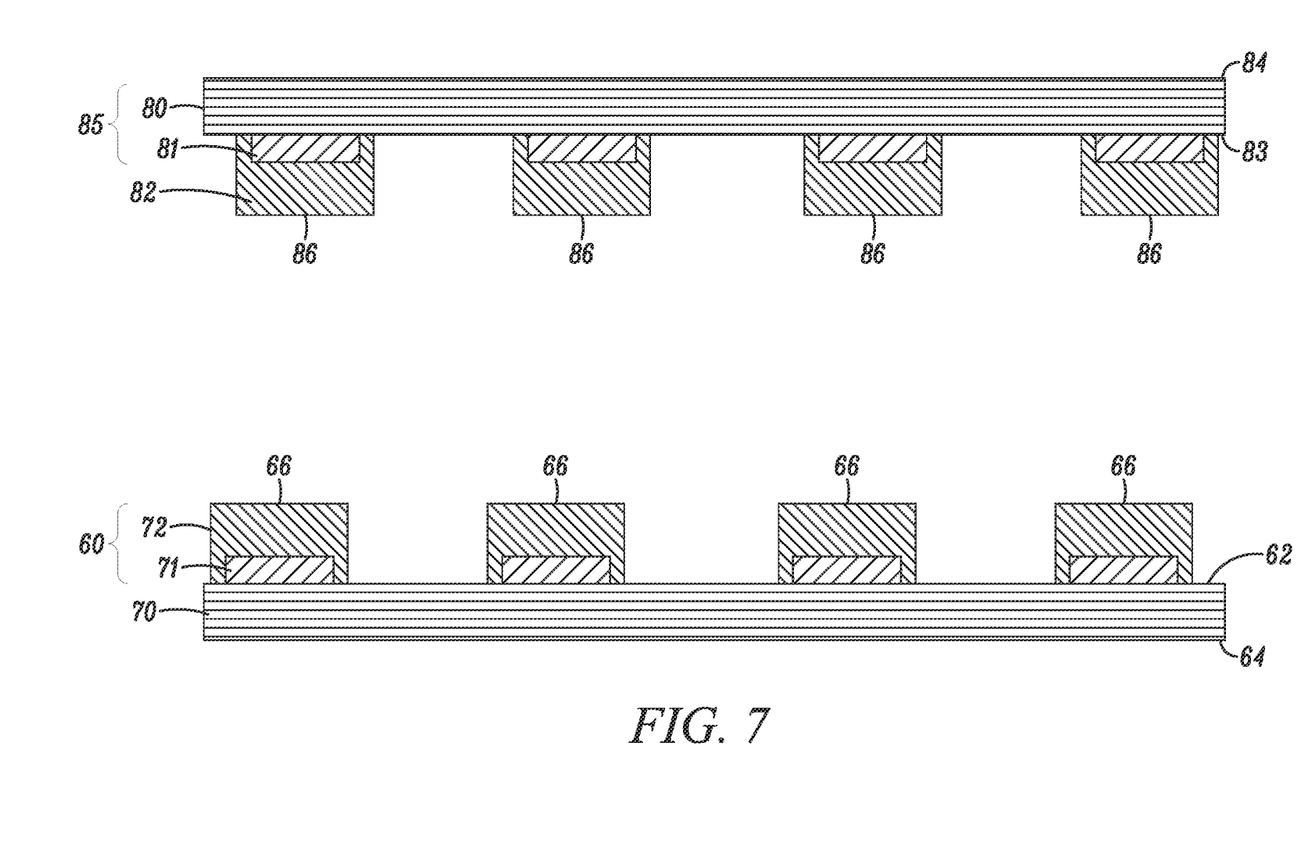
FIG. 7 depicts cross-sections of a transmitter coil GG' and a receiver coil HH' of an embodiment or the present invention comprising a conductive structure situated on a first major surface of a substrate where a first layer of conductive ink adheres to the first major surface; and a second layer of electroplated copper is situated onto the first layer.

Still another aspect, is shown in FIG. 7, which is a cross-section GG' of the transmitter coil 35 as shown in FIG. 3 and a cross-section HH' of the receiver coil 36 of FIG. 3, both having the Archimedean spiral of FIG. 1. The transmitter coil and the receiver coil of FIG. 7 are inductively coupled 37 as illustrated in FIG. 3. The transmitter coil includes a conductive structure 60 situated on an insulating substrate 70 having first 62 and second 64 opposing major surfaces, the conductive structure 60 having a preselected pattern 66 and comprising: a first layer of conductive ink 71 adhered to the first major surface 62; and a second layer of electroplated copper 72 situated onto the first layer of conductive ink 71. The receiver coil comprises a substrate 80 having a first major surface 83 and a second major surface 84. The conductive structure 85 has a preselected pattern 86 situated on the first major surface 83 of the substrate 80 comprising: a first layer of conductive ink 81 adhered to the first major surface 83; and a second layer of electroplated copper 82 situated onto the first layer of conductive ink 81.

EXAMPLES

The operation and effects of certain embodiments of the present invention may be more fully appreciated from the examples described below. The embodiment on which these examples are based is representative only, and the selection of these embodiments to illustrate aspects of the invention does not indicate that materials, components, conditions, techniques and/or configurations not described are not suitable for use herein, or that subject matter not described in the examples is excluded from the scope of the appended claims and equivalents thereof.

Example 1

Fabrication of a Conductive Structure on a Polyolefin Sheet Substrate

A conductive structure having the form of an Archimedean spiral, as depicted schematically in FIG. 1, was fabricated on a sheet of a TYVEK® polyethylene sheet, Type 10-1056DR (available from DuPont de Nemours, Inc., Wilmington, Del.). For Example 1, the spiral structure used had dimensions of $r_i$=16 mm, $r_o$=60 mm, w=2 mm, and P=4 mm/turn, and a total of 11 turns. The resulting length of the conductive trace was about 2.6 m, so the ratio of length to width was about 1300.

TYVEK® sheets (about 160 μm thick) were prepared in the form of 15 cm square coupons. A pattern of silver-containing conductive ink (PE828 ATM006, available from DuPont de Nemours, Inc., Wilmington, Del.) having the shape shown in FIG. 1 was printed on each using an AIM885 screen printer, with a thickness of about 13 μm. The printed pattern was cured in a box oven at 80° C. for 30 min with circulating air flow, thereby providing a precursor. The manufacturer represents this ink as having a resistivity of about 45 µΩ·cm after curing, so that a 13 µm layer exhibits a sheet resistance of about 0.034 Ω/square.

Thereafter, the silver ink pattern of the precursor was electroplated with copper to increase the conductance of the spiral. First, the ink surface was activated by a short predip of the coupon in a 10% sulfuric acid bath, then the sheet was placed in a plating bath of 35-75 g/L $Cu_2SO_4.5H_2O$, 180-225 g/L $H_2SO_4$, and 35-65 ppm $Cl^-$ (in the form of HCl) in $H_2O$. Organic brightener was maintained between 0.05 and 10 ppm and the carrier maintained at 500-2500 ppm. The silver ink was the cathode for the plating operation, with the power supply being connected to both the inside and outside ends of the spiral. The bath contained soluble Cu anodes. An operating temperature of 22-28° C. was maintained, with air, solution and paddle agitation throughout the plating cycle. Plating current densities of 10-30 ASF (amps per square foot) were used. A plating time of 4 h with a 20 ASF plating current resulted in a structure with a thickness of ~38 µm averaged over the length of the spiral.

Representative electrical properties measured for the bare silver ink of the precursor spiral and for the finished Cu-plated spiral are set forth in Table I.

TABLE I

Electrical Properties of Spiral Coil

| | Printed Ag | Ag + E-plated Cu |
|---|---|---|
| Averaged thickness <t> (µm) | ~13 | ~38 |
| Electrical resistance R (Ω) @100 Hz | 45 | 0.58 |
| Inductance (µH) @10 KHz | 9 | 8.9 |

DC resistance values were measured using a standard four-probe method. The resistance $R_{Cu}$ of the Cu layer itself (without the printed Ag seed layer) was calculated by assuming the measured total resistance R to be a parallel combination of the resistances of the bare Ag layer and the plated Cu layer. Then, assuming the Cu layer to have the resistivity ρ of pure Cu (1.7 µΩ·cm), and using the measured length l and width w of the spiral, the averaged thickness <t> of the plated Cu was calculated using the standard formula $$R_{Cu} = \frac{\rho l}{w \langle t \rangle}.$$

Inductance was measured using a BK Precision® LCR Meter Model 879B.

As evident in Table I, the principal effect of the plating is to lower the resistance of the coil by almost two orders of magnitude. The inferred average thickness <t>=38 µm is consistent with XRF measurements of the trace, which showed a thickness of ~100 µm at the connection points at the inner and outer ends and ~20 µm near the midpoint of the spiral length, which is most distant from the connection points. If the effective resistivity of the plated Cu is higher than the 1.7 µΩ·cm of bulk Cu, then the actual average thickness would be proportionately higher. Whereas the resistivity of the printed Ag is well below that of bulk Ag or Cu, the plated Cu trace has a resistivity approaching the value for high-purity, annealed bulk Cu. Both the increased thickness and the improved inherent low resistivity obtained in the plated copper trace are believed to contribute to the marked lowering of resistance.

A low resistance coil is beneficially employed in a number of applications. For example, the coil may be used in inductively coupled, wireless charging circuits, in which the coil's low resistance improves efficiency by reducing parasitic ohmic heating.

Example 2

Wireless, Inductive Power Transfer Coils

Techniques comparable to those used to fabricate the conductive structure of Example 1 were employed to make transmitter and receiver coils on Tyvek® substrates for use in an inductive power transfer system. The coils had an outer diameter $r_o$=120 mm, a trace width w=2 mm, a pitch P=4 mm/turn, and a total of 11 turns, as specified using the nomenclature of FIG. 1. After plating, the coils each had a DC resistance ~0.5Ω and an inductance of ~11 µH at 100 KHz. Using a pressure sensitive adhesive, substrates bearing the coils were then adhered to separate CORIAN® carriers about 1 mm thick for convenient handling.

The transmitter and receiver coils were energized and operated in accordance with the conventional Qi wireless charging protocol, which is widely used for inductively transferring power to devices such as smartphones. The Qi protocol and standards are promulgated by the Wireless Power Consortium and are available at www.wirelesspowerconsortium.com/qi/. The Qi protocol specifies placement of the transmitter and receiver coils in proximity. An AC current at a frequency (said to be typically at 87 to 205 kHz) flowing through the transmitter coil produces an AC magnetic that is inductively coupled to the receiver coil, in which a voltage is induced in accordance with Faraday's law. To improve power efficiency, the Qi protocol coils are often connected in parallel with a capacitance that provides an electrical resonance at least close to the operating frequency range.

Power transfer experiments were carried out with a Universal Qi Wireless Charging Transmitter (PRODUCT ID: 2162) and a Universal Qi Wireless Receiver Module (PRODUCT ID: 1901), which were obtained from Adafruit Industries, LLC, New York, N.Y. (on-line at www.adafruit.com). The transmitter and receiver coils supplied with the modules were replaced with the coils described above. The receiver module was connected to a Govee 5050 LED TV Backlight Strip (obtained from amazon.com), which included 22 RGB LED lamps.

The ability of this system to transfer power from the transmitter to the receiver and then to the LED load was then demonstrated. The substrates were disposed with the coils concentrically aligned with their respective planes approximately parallel and separated by 5 mm or less. The transmitter was then energized according to the manufacturer's directions, resulting in illumination of the LED lamps, demonstrating inductive transfer of energy from the power source, through the coupled coils, and delivered to the load by the receiver module. The measured voltage and current of 5 V and ~190 mA indicated a transferred power of ~0.95 W.

Example 3

Efficiency of Wireless, Inductive Power Transfer

A series of measurements was made to determine the efficiency of power transfer between the transmitter/receiver coil pair used in Example 2 at a range of coil spacings. The techniques used accorded generally with the description set forth by the Wireless Power Consortium at https://www.wirelesspowerconsortium.com/data/downloadables/1/6/2/9/john-perzow-wpc-efficiency.pdf. An overall efficiency of the charging system is measured as a ratio between the useful electric power derivable at the receiver output and the electric power supplied into the transmitter. For these experiments, the transmitter module was powered by an Agilent E3611A DC power supply, with the power input determined from the current and voltage supplied. Received power was determined by measuring the DC voltage and current through a resistor connected to the output terminals of the receiver module. Experiments were carried out with the same transmitter and receiver modules connected either to the as-supplied commercial coil pair or the present printed/plated coil pair.

The commercial coils were found to be fabricated with conventional Litz wire. As known in the art, Litz wire is a conductor that comprises multiple strands of thin, insulated wire. Because of the skin effect, the current flow in a conductor carrying an AC current is not uniform across the cross-section, so that there is a larger ohmic loss than would be expected for a given diameter wire if the skin depth at the AC operating frequency is appreciably smaller than the actual diameter. This loss can be mitigated by using multiple strands of isolated conductors, so that AC current flow is relatively uniform across the aggregate conductor area in a form such as Litz wire.

The as-supplied Litz wire transmitter coil had an inner diameter $r_i$=19 mm, an outer diameter $r_o$=40 mm, a thickness of about 1 mm, and a total of 10 turns. It was situated atop a Daido steel shielding material. The Litz-wire receiver coil was generally rectangular, with a 41 mm length and a 29 mm width, a thickness of about 0.4 mm, and 28 turns in a compact bundle. The Litz coils had a DC resistance of ~0.12 ohm, as measured using a Keithley Model 3000 Multimeter.

Figure 4:
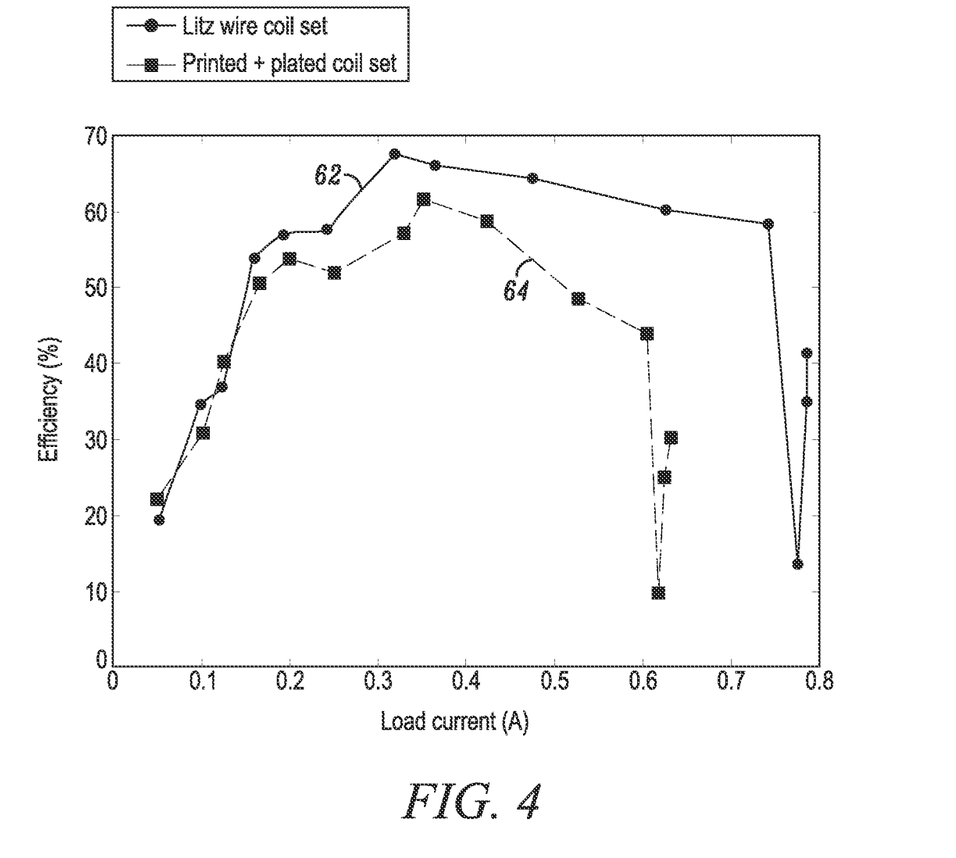
FIG. 4 is a graph plotting the efficiency of wireless, inductive energy transfer using coils of the invention and conventional coils as a function of load.

FIG. 4 is a graph showing the efficiency of power transfer for the two coil sets as a function of the load current for the as-furnished Litz-wire coil pair (curve 62) and the present printed/plated coils (curve 64). Resistors with DC resistance values ranging from 1 to 100Ω were used as the load to obtain a broad range of load currents on the receiver side. The input voltage to the transmitter was set at a constant 5 V. For each of the load resistances, the input current through the transmitter and the DC voltage and current delivered at the load were measured. The efficiency was calculated as the ratio of power delivered (voltage times current in the load resistor) to the input DC power (input voltage times current). The calculated efficiency is plotted in FIG. 4 as a function of load current.

Figure 5:
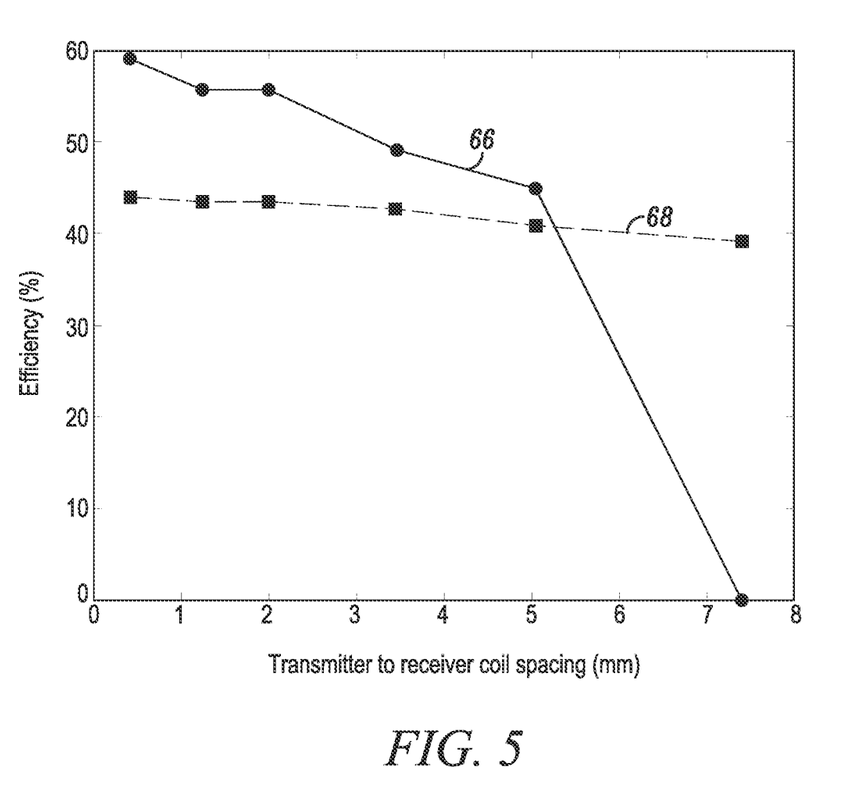
FIG. 5 is a graph plotting the efficiency of wireless, inductive energy transfer using coils of the invention and conventional coils as a function of the separation between the coils.

FIG. 5 is a graph showing the efficiency of power transfer for the two coil sets as a function of separation distance. The coil sets were aligned with their planes in parallel and their centers on a common line. A constant 5 resistor load was maintained at the different separation distances. Although the Litz wire coils (curve 66) were more efficient at lower separation distance, the present printed/plated coils (curve 68) were able to transfer power more consistently at larger separation distances.

Having thus described the invention in rather full detail, it will be understood that this detail need not be strictly adhered to but that further changes and modifications may suggest themselves to one skilled in the art, all falling within the scope of the invention as defined by the subjoined claims.

The embodiments of the wireless power transfer system and its components described herein, including the examples, are not limiting; it is contemplated that one of ordinary skill in the art could make minor substitutions and not substantially change the desired properties and its functioning in a system.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

Certain terminology may be employed herein for clarity and convenience of description, rather than for any limiting purpose. For example, the terms "forward," "rearward," "right," "left," "top," "bottom," "upper," and "lower" designate directions in the drawings to which reference is made. The various drawings may depict the present components oriented in a convenient configuration. Terminology of similar import other than the words specifically mentioned above likewise is to be considered as being used for purposes of convenience rather than in any limiting sense.

What is claimed is:

1. A system for wirelessly transferring electrical energy from a source to a load, the system comprising a transmitter circuit configured to be energized by the source and electrically connected to a transmitter coil and a receiver circuit configured to drive the load and electrically connected to a receiver coil, the transmitter and receiver coils being configured to be inductively coupled, and wherein at least one of the transmitter coil and the receiver coil comprises a conductive structure situated on a first major surface of a substrate and having the form of a spiral conductor comprising a plurality of turns, the conductive structure comprising:

(a) a first layer of conductive ink adhered to the first major surface; and (b) a second layer of electroplated copper situated onto the conductive ink of the first layer.

2. The system of claim 1, wherein each of the transmitter coil and the receiver coil comprises a conductive structure situated on a first major surface of a substrate and having the form of a spiral conductor comprising a plurality of turns, each of the conductive structures comprising:
  (a) a first layer of conductive ink adhered to the first major surface; and
  (b) a second layer of electroplated copper situated onto the conductive ink of the first layer.

3. A transmitter comprising a transmitter module and a transmitter coil electrically connected thereto, the transmitter coil comprising a conductive structure, wherein the conductive structure is situated on an insulating surface having a first and second opposing major surfaces and the conductive structure has a preselected pattern and the conductive structure comprises:
  (a) a first layer of conductive ink having the preselected pattern and adhered to the first major surface; and;
  (b) a second layer of electroplated copper situated onto the conductive ink of the first layer;
  and wherein the transmitter module is configured to be connected to a source and to energize the transmitter coil to produce an electromagnetic field, whereby electrical energy is wirelessly delivered from the source to a receiver comprising a receiver coil and receiver circuitry connected thereto, the receiver coil being inductively coupled to the transmitter coil and the receiver circuitry being configured to deliver the electrical energy to a load connected thereto.

4. The transmitter of claim 3, wherein the conductive structure is situated on a first major surface of a substrate and has the form of a spiral conductor comprising a plurality of turns.

\* \* \* \* \*